United States Patent
Dreser et al.

(10) Patent No.: US 9,019,675 B2
(45) Date of Patent: Apr. 28, 2015

(54) METHOD AND STRUCTURE FOR DETECTING AN OVERCURRENT IN A TRIAC

(75) Inventors: Jan Dreser, Kladno (CZ); Laurent Gonthier, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 154 days.

(21) Appl. No.: 13/242,928

(22) Filed: Sep. 23, 2011

(65) Prior Publication Data

US 2012/0087052 A1 Apr. 12, 2012

(30) Foreign Application Priority Data

Oct. 6, 2010 (EP) .................................... 10306087

(51) Int. Cl.
*H02H 3/08* (2006.01)
*H02H 9/02* (2006.01)
*G01R 19/165* (2006.01)

(52) U.S. Cl.
CPC ................ *G01R 19/16571* (2013.01)

(58) Field of Classification Search
CPC ........................................... H02H 3/08
USPC ....................... 361/93.1, 93.2, 93.9
See application file for complete search history.

(56) References Cited

U.S. PATENT DOCUMENTS

| | | | |
|---|---|---|---|
| 4,737,671 A | 4/1988 | Nutz et al. | |
| 5,734,289 A | 3/1998 | Khudoshin | |
| 2003/0179527 A1 | 9/2003 | Chea, Jr. | |
| 2007/0093928 A1* | 4/2007 | Forster et al. | 700/168 |
| 2007/0273429 A1 | 11/2007 | Ribeiro Duarte | |
| 2009/0033235 A1* | 2/2009 | Mehta | 315/194 |

* cited by examiner

*Primary Examiner* — Thienvu Tran
*Assistant Examiner* — Christopher Clark
(74) *Attorney, Agent, or Firm* — Slater & Matsil, L.L.P.

(57) ABSTRACT

A method comprising: a) during at least part of a conduction phase of the triac, measuring the gate potential of the triac; and b) comparing a value based on said measurement with a reference threshold and deducing the presence or the absence of an overcurrent based on said comparison.

28 Claims, 2 Drawing Sheets

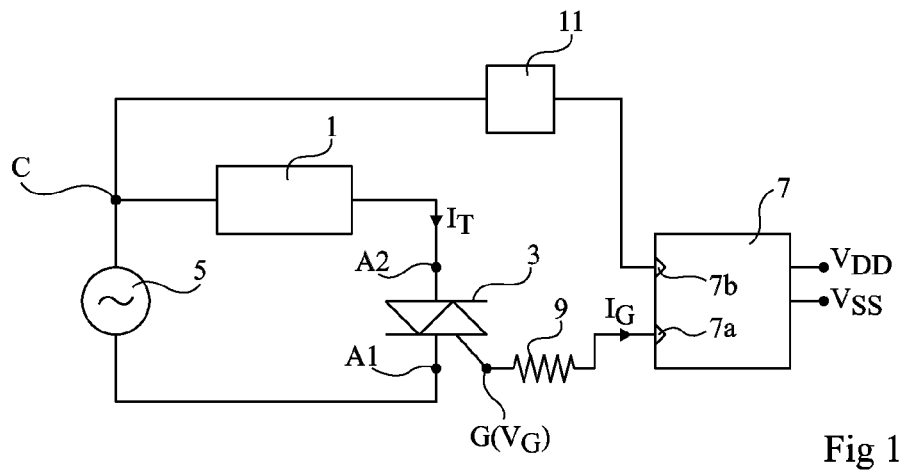
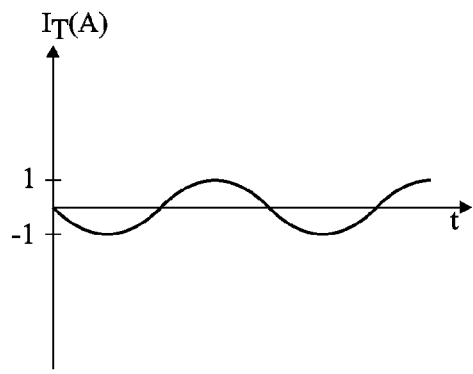
Fig 2A
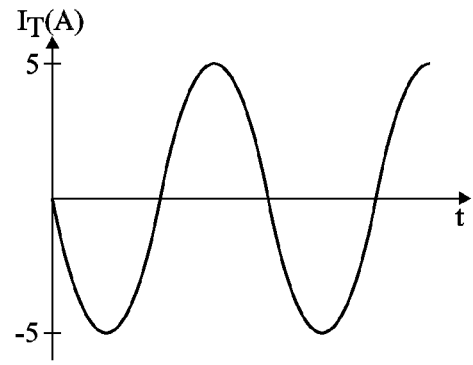
Fig 3A
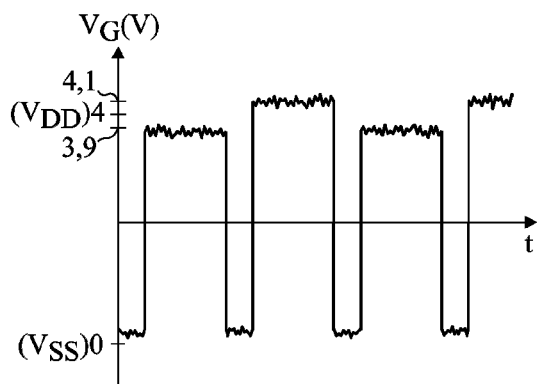
Fig 2B
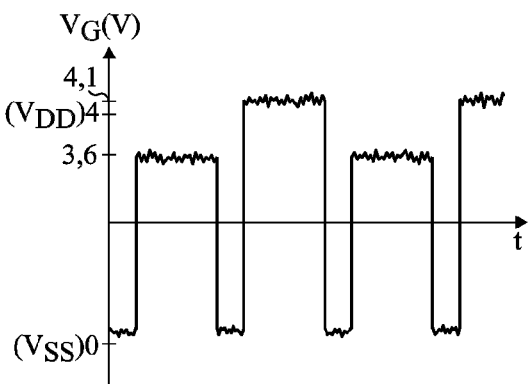
Fig 3B

METHOD AND STRUCTURE FOR DETECTING AN OVERCURRENT IN A TRIAC

CROSS-REFERENCE TO RELATED APPLICATIONS

This application claims the priority benefit of European Patent Application Number 10306087.7, filed Oct. 6, 2010, entitled "A Method of Detecting an Overcurrent in a Triac," which is hereby incorporated by reference to the maximum extent allowable by law.

TECHNICAL FIELD

The present invention relates to detecting an overcurrent in a triac.

BACKGROUND

A triac is a bidirectional component that comprises two conduction or main terminals A1 and A2, and a gate terminal G. If a potential difference exists between the main terminals A1 and A2, the triac may be turned on by applying an adapted triggering current between the gate terminal and terminal A1 which will be called the reference terminal or main terminal associated with the gate. Once triggered, the triac remains conductive as long as the current flowing through it is above a threshold called "the holding current", and then automatically turns off when this current falls below the holding current.

A triac may be used to control the power delivered to a load coupled to an alternating current source, for example mains/household electricity. The current source is coupled to a series connection of the triac with the load, and the power delivered to the load is controlled by turning on and turning off the triac.

In some cases, dysfunction of the load may lead to abnormally high currents flowing through the triac, which may cause it to be damaged.

As an example, we consider the case where the load is a compressor of a refrigerator. A starting current with an amplitude of approximately 6 to 12 A is used to start up the motor of the compressor. After between 0.4 and 1 second, the current through the triac generally stabilizes to a nominal level, with an amplitude of approximately 1 A or 2 A. If the motor dysfunctions, notably if the motor jams at start up or while running, the current through the triac is maintained at a high level (6 to 12 A) for an undetermined period. Such a current is likely to damage the triac or the motor if it stays high for too long, for example for more than 10 seconds.

A protection system has been proposed that comprises a device for measuring the current running through a triac (between the main terminals A1 and A2), and means for stopping the triggering current of the triac (gate current), or setting up an alarm signal, when an overcurrent is detected. The interruption of the gate current causes the triac to turn off, and the load ceases to be powered.

A disadvantage of such a protection system is that it comprises components specifically dedicated to the measurement of the current through the triac. Among these components, at least one resistor is provided, serially coupled to the triac. Thus, part of the power supplied by the source is dissipated in the protection system.

Another type of protection system has been proposed that comprises a device for measuring the temperature of the triac. An abnormal temperature rise indicates an overcurrent in the triac. Means are provided for interrupting the triggering current (gate current) when the temperature exceeds a threshold. The triac then turns off, and the load ceases to be powered.

A disadvantage of such a system lies in its relatively high cost. In addition, since the temperature rise is relatively slow, the triac is turned off rather late, and may be damaged before the protection system is activated.

A fuse protection system could also be provided. However, in the above example of a refrigerator, it raises the problem of distinguishing between the normal start up current and the current occurring if the motor jams, the latter current having identical amplitude but running through the triac for a longer time. Another disadvantage of a fuse system is that once the protection system has been triggered, the device is made unusable until the fuse is replaced or reset.

It would be desirable to provide a protection system for a triac that is simpler and more efficient than existing systems.

It would notably be desirable to be able to detect easily and rapidly an overcurrent in a triac.

SUMMARY OF THE INVENTION

According to one aspect of the present invention, there is provided a method of detecting an overcurrent in a triac, the method comprising: a) during at least part of a conduction phase of the triac, measuring the gate potential of the triac; and b) comparing a value based on said measurement with a reference threshold and deducing the presence or the absence of an overcurrent based on said comparison.

According to a further aspect of the present invention, there is provided a module for driving a triac coupled, in series with a load, to a periodic alternating current source, the module comprising: a pin for applying a triggering current to the gate of the triac; and circuitries associated with said pin for: measuring, during at least part of a conduction phase of the triac, the gate potential of the triac from said pin; comparing a value based on said measurement with a reference threshold; and deducing the presence or the absence of an overcurrent based on said comparison.

According to a further aspect of the present invention, there is provided a module of driving a triac coupled, in series with a load, to a periodic alternating current source, the module comprising: a first pin for applying a triggering current to the gate of the triac; a second pin for measuring the gate potential of the triac; and circuitries associated with said second pin for: measuring, during at least part of a conduction phase of the triac, the gate potential of the triac from said second pin; comparing a value based on said measurement to a reference threshold; and deducing the presence or the absence of an overcurrent based on said comparison.

BRIEF DESCRIPTION OF THE DRAWINGS

The foregoing objects, features, and advantages, as well as others, will be discussed in detail in the following non-limiting description of specific embodiments in connection with the accompanying drawings, in which:

FIG. 1 is an electric diagram of an embodiment of a power supply block comprising a triac and a system for protecting the triac against overcurrents;

FIG. 2A is a timing diagram illustrating the evolution, during normal operation, of the current through a triac of a power supply block;

FIG. 2B is a timing diagram illustrating the evolution, during normal operation, of the gate potential of a triac of a power supply block;

FIG. 3A is a timing diagram illustrating the evolution of the current through a triac of a power supply block in the event of an overcurrent;

FIG. 3B is a timing diagram illustrating the evolution of the gate potential of a triac of a power supply block in the event of an overcurrent;

DETAILED DESCRIPTION OF ILLUSTRATIVE EMBODIMENTS

Figure 4:
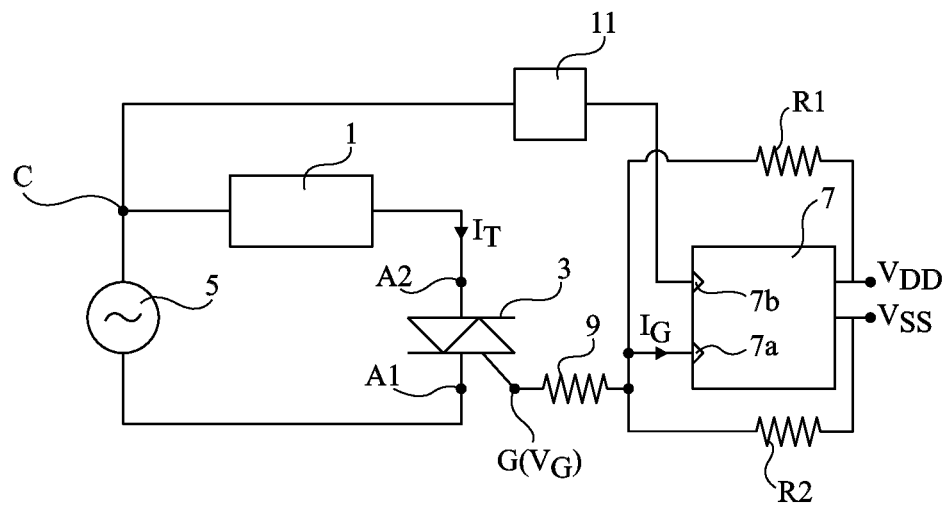
FIG. 4 is an electrical diagram of another embodiment of a power supply block comprising a triac and a system for protecting the triac against overcurrents.

Before discussing the illustrated embodiments in detail, various embodiments and advantageous features thereof are discussed herein generally. Thus, an advantageous feature of an embodiment of the present invention is to provide a method of detecting an overcurrent in a triac which overcomes at least part of the disadvantages of the prior art. A further advantageous feature of an embodiment of the present invention is to provide a method that is simpler to implement than prior art solutions. Yet another advantageous feature of an embodiment of the present invention is to provide a method that can be implemented using exclusively components that are normally used to drive a triac. A still further advantageous feature of an embodiment of the present invention is to provide a method that allows an overcurrent to be detected more quickly than in prior art solutions.

In some embodiments, there is provided a method of detecting an overcurrent in a triac, the method comprising: a) during at least part of a conduction phase of the triac, measuring the gate potential of the triac; and b) comparing a value based on said measurement with a reference threshold and deducing the presence or the absence of an overcurrent based on said comparison. According to one embodiment, said value is an average value of the gate potential during said measurement.

In some embodiments, a periodic alternating current flows through the triac, said conduction phase is comprised within a half wave of a first polarity, and steps a) and b) are repeated at each period of the current. According to another embodiment, said first polarity is negative.

Some embodiments provide a module for driving a triac coupled, in series with a load, to a periodic alternating current source, the module comprising: a pin for applying a triggering current to the gate of the triac; and circuitries associated with said pin for: measuring, during at least part of a conduction phase of the triac, the gate potential of the triac from said pin; comparing a value based on said measurement with a reference threshold; and deducing the presence or the absence of an overcurrent based on said comparison.

According to one embodiment, said circuitries comprise a microcontroller and said pin is an input-output pin of the microcontroller. According to one embodiment, the module further comprises a voltage divider comprising a first resistor connected between said pin and a high supply voltage terminal, and a second resistor connected between said pin and a low supply voltage terminal.

Yet other embodiments provide a module of driving a triac coupled, in series with a load, to a periodic alternating current source, the module comprising: a first pin for applying a triggering current to the gate of the triac; a second pin for measuring the gate potential of the triac; and circuitries associated with said second pin for: measuring, during at least part of a conduction phase of the triac, the gate potential of the triac from said second pin; comparing a value based on said measurement to a reference threshold; and deducing the presence or the absence of an overcurrent based on said comparison.

According to one embodiment, said circuitries comprises a microcontroller and said first pin and said second pin are respectively an output pin and an input pin of the microcontroller.

Attention is now directed to the embodiments illustrated in the drawings. For clarity, the same elements have been designated with the same reference numerals in the different drawings.

FIG. 1 is an electrical diagram of an embodiment of a power supply block comprising a triac and a system for protecting this triac against overcurrents.

An alternating current or voltage source 5 is applied to the series connection of a load 1 with a triac 3. The main terminals A1 and A2 of the triac are respectively coupled to the source 5 and to the load 1, and the gate G of the triac is coupled to a pin 7a of a microcontroller 7, for example via a resistor 9 or via any other suitable circuit. The microcontroller 7 allows the triac to be controlled by applying or not applying a triggering current $I_G$ to the gate. High voltage $V_{DD}$ and low voltage $V_{SS}$ terminals are provided for the power supply of the microcontroller 7. It should be noted that in order to allow the microcontroller 7 to apply a triggering current between the gate terminal and the reference terminal A1, terminal A1 should be coupled either with the low voltage terminal $V_{SS}$ or with the high voltage terminal $V_{DD}$. In this example, the reference terminal A1 is coupled to the high voltage terminal $V_{DD}$. In this example, a circuit 11 is coupled between a node C, common to the source 5 and to the load 1, and an input pin 7b of the microcontroller 7. The circuit 11 detects the zero crossings of the alternating power supply voltage of the load, allowing for example the output of triggering pulses, via pin 7a, synchronized with the power supply voltage.

In an example of an operation mode, pin 7a initially has high impedance, and for example a high potential close to the high power supply voltage $V_{DD}$ of the microcontroller (due to the coupling between A1 and $V_{DD}$). At each zero crossing of the alternating current $I_T$ passing through the triac 3, pin 7a is briefly forced to a low potential, for example close to the low power supply voltage $V_{SS}$. Pin 7a then has low impedance. As a result, a gate current $I_G$ briefly passes through the triac, causing the triac to turn on.

In another example of an operation mode, in order to supply power to the load, pin 7a remains permanently forced to a low potential, for example close to $V_{SS}$. Hence, a gate current permanently passes through the triac, maintaining the triac on.

In another example of an operation mode, pin 7a is briefly forced to a low value at an intermediate instant of each half wave or of each period of the power supply current, so that the triac will be conductive during only a part of each half wave, for example the end period of the half wave, or of each period of the supply current (phase angle command).

More generally, any other sequence may be used to drive the triac.

The inventors have noticed that during the conduction phases of the triac, the potential $V_G$ of the gate terminal G varies slightly, in proportion to the intensity of the current $I_T$ through the triac. It will be noted that the variation of potential $V_G$ with the temperature of the triac is negligible. We propose here to measure the potential $V_G$ during conduction phases of the triac, and to use this measurement for detecting possible overcurrent in the triac.

FIGS. 2A and 2B are timing diagrams illustrating respectively the evolution of the current $I_T$ through the triac, and the evolution of the gate potential $V_G$ of the triac, in an example of an operation mode in which triggering pulses are applied at each zero crossing of the current $I_T$.

FIGS. 2A and 2B correspond to a normal operation of the device, in a steady state. The current $I_T$ through the triac is then an alternating current oscillating between −1 A and 1 A, at a frequency of 50 Hz (mains).

At each zero crossing of the current $I_T$, that is every 10 ms in this example, the gate potential $V_G$ of the triac is briefly forced to a low value, for example close to the low power supply potential $V_{SS}$ of the microcontroller, which is 0 V in this example. In this example, the triggering pulses have a duration of approximately 1 to 3 ms.

Between two pulses, pin 7a is at a high impedance, and at a high voltage, close to the high power supply potential $V_{DD}$ of the microcontroller, which is 4 V in this example. The gate potential $V_G$ of the triac varies around this high value, in proportion to the intensity of the current $I_T$. As an example, during a negative half wave of the current $I_T$, the gate potential $V_G$ remains close to an average value of approximately 3.9 V, and, during a positive half wave of the current $I_T$, the potential $V_G$ remains close to an average value of approximately 4.1 V.

FIGS. 3A and 3B are timing diagrams illustrating, as with FIGS. 2A and 2B, the evolutions of the current $I_T$ through the triac and of the gate potential $V_G$, in an operation mode in which triggering pulses are applied at each zero crossing of the current $I_T$, but for an amplitude of the current $I_T$ clearly higher than in the example of FIGS. 2A and 2B. In this example, $I_T$ oscillates between −5 A and 5 A, which corresponds to an overcurrent.

Between two triggering pulses of the triac, the gate potential $V_G$ varies around a high value, close to 4 V in this example, as a function of the intensity of the current $I_T$. In this example, during a negative half wave of the current I, the potential $V_G$ remains close to an average value of approximately 3.6 V, as compared to 3.9 V in normal operation. During a positive half wave of the current $I_T$, the potential $V_G$ remains close to an average value of approximately 4.1 V.

The greater the amplitude of current $I_T$, the more the average level of potential $V_G$ during a negative half wave of current $I_T$ differs from the high central value, which is 4 V in this example.

We propose, in this example, to measure, at each negative half wave of the current $I_T$, the average level of potential $V_G$ during at least one time interval of a conduction phase of the triac, and to compare this level to a reference level (for example 3.9 V in the example of FIGS. 2A and 2B). If the measured average level differs too much from the reference level, an overcurrent is detected. The triggering signal of the triac may then be interrupted in order to turn off the triac.

As a variant, a detection criterion other than the average value of potential $V_G$ during the measurement time interval can be used. We can for example provide a smoothing of the evolution curve of $V_G$ during the measurement time interval, and use the minimal value of the smoothed curve as the detection criterion of an overcurrent.

It should be noted that in the example illustrated by FIGS. 2A to 3B, during a positive half wave of the current $I_T$, the average level of potential $V_G$ remains bounded to a value close to 4.1 V, even in the event of an overcurrent. As a result, an overcurrent cannot be detected during positive half waves of the current $I_T$.

Embodiments of the invention are not restricted to the example described above and illustrated by FIGS. 2A and 2B, in which the triac is triggered by forcing the gate G to a low state. The triac can also be triggered by forcing the gate G to a high state, for example close to $V_{DD}$, the reference terminal A1 being coupled to the low voltage terminal $V_{SS}$.

Between two triggering pulses, potential $V_G$ then varies around a low value, for example close to $V_{SS}$. The level of potential $V_G$ (average level or maximal level) can be measured during a time interval of a negative half wave of current $I_T$, and used as a criterion for detecting an overcurrent. In this configuration, during negative half waves of current $I_T$, $V_G$ varies below the low supply potential $V_{SS}$. In order to read $V_G$ directly from a pin of the microcontroller, $V_G$ should then be raised to a level above $V_{SS}$, for example by using a voltage divider.

FIG. 4 is an electrical diagram illustrating an alternative embodiment of the proposed protection system, allowing overcurrents to be detected in an operation mode in which the triac is triggered by forcing the gate G to a high state, for example close to $V_{DD}$ (the reference terminal A1 being coupled to the low voltage terminal $V_{SS}$).

The diagram of FIG. 4 comprises the same elements as the diagram of FIG. 1, and further comprises a voltage divider between the gate G and pin 7a. The voltage divider comprises a first resistor R1 connected between pin 7a and $V_{DD}$, and a second resistor R2 connected between pin 7a and $V_{SS}$.

It should be noted that in this case, as in the above mentioned case, an overcurrent cannot be detected during positive half waves of current $I_T$.

In order to measure potential $V_G$, we can for example use a pin of microcontroller 7. The calculation of the average level can be implemented by the microcontroller itself, by sampling and digitising the voltage $V_G$. Thus, an advantage of the proposed method of detecting an overcurrent is that it can be implemented without any additional components, when compared to a normal driving system for a power supply block.

When a high current is detected in the triac, the driving software of the microcontroller can recognize whether the load is in a starting phase. Thus, the proposed protection system may for example distinguish whether the high current detected is a normal start-up current, for example in the above-mentioned case of the motor of the compressor of a refrigerator, or an overcurrent resulting from a dysfunction.

In the case of a 50 Hz power supply (mains), a measurement can be taken every 20 ms. Thus, the proposed method allows a fast detection of an overcurrent. As a comparison, current protection devices using a measurement of the temperature of the triac have response times of several seconds.

In an embodiment of the proposed protection system, the measurement of the potential $V_G$ can be made from the same pin 7a of the microcontroller as the one used to apply pulses for triggering the triac. We consider the case where the triac is driven by periodic pulses applied to its gate via pin 7a. The potential $V_G$ between two successive triggering pulses can be read from the pin 7a itself. For this purpose, the pin 7a is for example an input-output pin of the microcontroller. During the triggering pulses, pin 7a is used as an output pin. However, for the measurement of $V_G$, the pin 7a is used as an input pin.

It will be noted that in practice, in many existing systems, triacs of power supply blocks are usually driven via an input-output pin of a microcontroller, this pin being used only as an output pin to apply a triggering signal.

Thus, an advantage of the protection system described herein is that it can be implemented by a simple modification of the driving software of the microcontroller.

It will however be noted that in a driving mode of the triac in which a triggering signal is permanently applied on the gate G by the microcontroller, with $V_G$ being for example permanently forced to a low state, it is not possible to measure the evolutions of $V_G$ directly via pin 7a. Indeed, pin 7a cannot be used simultaneously as an output pin for applying the triggering signal and as an input pin for reading $V_G$.

Furthermore, in some configurations, an amplifier circuit is used between pin 7a and the gate G of the triac. In that case, pin 7a cannot be used to measure the evolutions of $V_G$.

Figure 5:
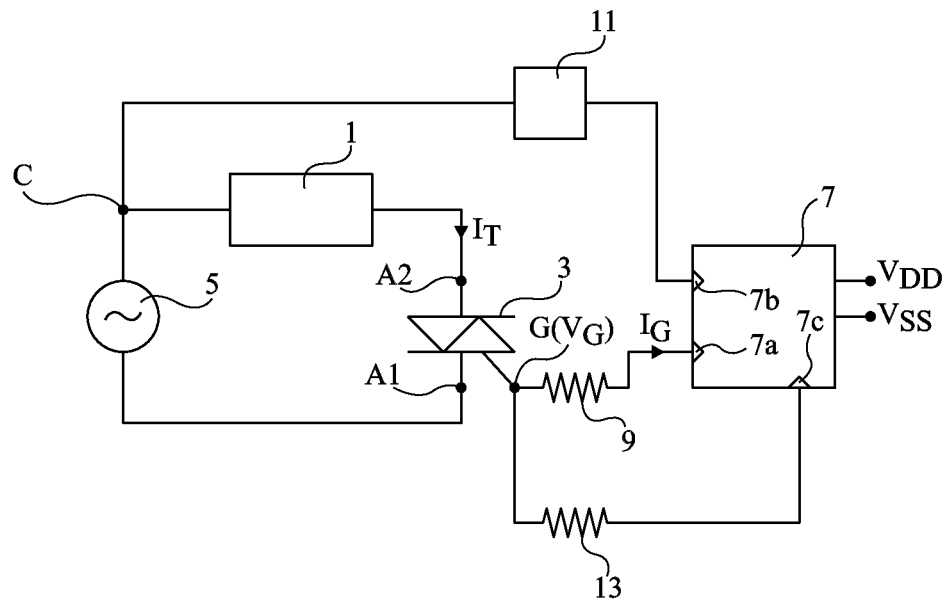
FIG. 5 is an electrical diagram of another embodiment of a power supply block comprising a triac and a system for protecting the triac against overcurrents.

FIG. 5 is an electrical diagram illustrating an alternative embodiment of the proposed protection system, allowing overcurrents to be detected even when a triggering signal is permanently applied to the gate of the triac. More generally, the present embodiment allows overcurrents to be detected even if the pin used for applying a triggering current to the triac is not available for measuring the evolutions of the gate potential of the triac. The diagram of FIG. 5 comprises the same elements as the diagram of FIG. 1, and further comprises, between the gate terminal G of the triac and an input pin 7c of the microcontroller, a resistor 13. The additional input pin 7c allows variation in $V_G$ to be measured at any instant, even when a triggering signal is applied on the gate G via the pin 7a, or if an amplifier circuit is connected between pin 7a and gate G.

While various specific embodiments of the present invention have been described, various alterations and modifications will occur to those skilled in the art.

In particular, embodiments of the present invention are not restricted to the numerical values or to the driving modes of the triac mentioned as examples in the present description. It will be within the abilities of those skilled in the art to adapt the proposed method of detection of an overcurrent to any mode of connection or to any mode of utilisation of the triac.

Further, we have described above examples of embodiments of power supply blocks in which a triac is driven by a microcontroller. It will be within the abilities of those skilled in the art to adapt the proposed method of detecting an overcurrent to any driving circuit of the triac. If useful, additional components may be provided to implement the steps of measuring the level of the gate potential $V_G$ and comparing this level to a reference level.

Further, we have described above examples of embodiments in which the main terminals A1 and A2 of a triac are respectively coupled to an alternating supply source and to a load. Embodiments of the invention are not restricted to this particular case. It will be within the abilities of those skilled in the art to implement the desired operation whatever the mode of connection of the triac to the source and to the load.

Further, it will be understood that the term triac, as used herein, includes components implementing the same function as a triac, for example bidirectional conduction components having their gate referenced to the back side, such as components commercialized by the applicant under the trademark ACS.

What is claimed is:

1. A method of detecting an overcurrent in a triac, the method comprising:
    a) during a negative half-wave cycle of a conduction phase of the triac, measuring the gate potential of the triac; and
    b) comparing a value based on said measurement during the negative half-wave cycle with a reference threshold and deducing the presence or the absence of an overcurrent based on said comparison.

2. The method of claim 1, wherein said value is an average value of the gate potential during said measurement.

3. The method of claim 1, wherein a periodic alternating current flows through the triac, and wherein steps a) and b) are repeated at each period of the current.

4. A module for driving a triac coupled, in series with a load, to a periodic alternating current source, the module comprising:
    a pin coupled to apply a triggering current to a gate of the triac; and
    circuitry associated with the pin, the circuitry configured to:
        measure the gate potential of the triac from said pin during a negative half-wave cycle of a conduction phase of the triac;
        compare a value based on said measurement during the negative half-wave cycle with a reference threshold; and
        deduce the presence or the absence of an overcurrent based on said comparison.

5. The module of claim 4, wherein said circuitry comprises a microcontroller and wherein said pin is an input-output pin of the microcontroller.

6. The module of claim 4, further comprising a voltage divider comprising a first resistor connected between said pin and a high supply voltage terminal, and a second resistor connected between said pin and a low supply voltage terminal.

7. A module for driving a triac coupled, in series with a load, to a periodic alternating current source, the module comprising:
    a first pin coupled to apply a triggering current to a gate of the triac;
    a second pin coupled to measure a gate potential of the triac; and
    circuitry coupled to the second pin, the circuitry configured to:
        measure, during a negative half-wave cycle of a conduction phase of the triac, the gate potential of the triac from said second pin;
        compare a value based on said measurement during the negative half-wave cycle to a reference threshold; and
        deduce the presence or the absence of an overcurrent based on said comparison.

8. The module of claim 7, wherein said circuitry comprises a microcontroller and wherein said first pin and said second pin are respectively an output pin and an input pin of the microcontroller.

9. An electronic system comprising:
    an alternating current source;
    a load coupled in series with the alternating current source;
    a current regulator coupled in series with the alternating current source and the load, the current regulator having a conduction phase and a non-conduction phase, and further comprising
        a first main terminal coupled to the load,
        a second main terminal coupled to the alternating current source, and
        a gate terminal; and
    a control circuit coupled to the gate terminal, the control circuit configured to measure voltage on the gate terminal during a negative half-wave cycle of a conduction phase and determine whether an overcurrent condition exists based on the measurement taken during the negative half-wave cycle.

10. The electronic system of claim 9, wherein said current regulator comprises a triac.

11. The electronic system of claim 9, wherein said control circuit comprises a microprocessor.

12. The electronic system of claim 9, wherein said load comprises a motor.

13. The electronic system of claim 9, further comprising a zero crossing detector coupled to the alternating current source.

14. The electronic system of claim 9, further comprising a voltage divider coupled to the gate terminal.

15. The electronic system of claim 11, wherein the gate terminal is coupled to an input/output pin of the microprocessor.

16. The electronic system of claim 11, wherein the microprocessor is configured to measure and determine under control of software instructions.

17. The electronic system of claim 11, wherein the microprocessor is further configured to place the current regulator in the non-conduction phase upon a determination that an overcurrent condition exists.

18. The electronic system of claim 13, wherein the control circuit has a first input pin coupled to the zero crossing detector, a second input pin coupled to the gate terminal, and a first output pin coupled to the gate terminal.

19. The electronic system of claim 14, wherein the voltage divider comprises a first resistor coupled between the gate terminal and a first logic voltage supply node and a second resistor coupled between the gate terminal and a second logic voltage supply node.

20. A method comprising:
    measuring a gate potential of a triac when a negative maximum current value of an alternating current is being input to a first main terminal of the triac; and
    determining information related to a current flowing through the triac during a conduction phase of the triac, the information based on the measured gate potential, wherein determining the information comprises determining whether the gate potential indicates an overcurrent condition within the triac.

21. The method of claim 20, wherein measuring the gate potential comprises repeatedly measuring the gate potential during a negative half wave of the alternating current input.

22. The method of claim 21, wherein determining the information comprises determining an average potential value based on repeatedly measuring the gate potential.

23. The method of claim 21, wherein determining the information comprises determining a negative maximum potential value based on repeatedly measuring the gate potential.

24. The method of claim 20, wherein the measuring and determining are performed during every period of the alternating current.

25. The method of claim 20, further comprising controlling the triac to enter a non-conduction phase if the gate potential indicates an overcurrent condition within the triac.

26. The method of claim 20, wherein the first main terminal of the triac is coupled to a load and a second main terminal of the triac is coupled to a low voltage terminal VSS.

27. The electronic system of claim 9, wherein the second main terminal is coupled to a low voltage terminal VSS.

28. The method of claim 1, further comprising during measuring the gate potential of the triac during a positive half-wave cycle of the conduction phase of the triac, wherein it is not possible to deduce the presence or the absence of an overcurrent based on the measurement during the positive half-wave cycle.

* * * * *